United States Patent
Hunt-Schroeder et al.

(10) Patent No.: US 10,382,049 B1
(45) Date of Patent: Aug. 13, 2019

(54) ON-CHIP CALIBRATION CIRCUIT AND METHOD WITH HALF-STEP RESOLUTION

(71) Applicant: GLOBALFOUNDRIES INC., Grand Cayman (KY)

(72) Inventors: Eric Hunt-Schroeder, Essex Junction, NY (US); John A. Fifield, Underhill, VT (US)

(73) Assignee: GLOBALFOUNDARIES INC., Grand Cayman (KY)

( * ) Notice: Subject to any disclaimer, the term of this patent is extended or adjusted under 35 U.S.C. 154(b) by 0 days.

(21) Appl. No.: 16/122,993

(22) Filed: Sep. 6, 2018

(51) Int. Cl.
  *H03M 1/10* (2006.01)
  *G01R 35/00* (2006.01)
  *H03M 1/66* (2006.01)
  *H03M 1/06* (2006.01)

(52) U.S. Cl.
  CPC ........ *H03M 1/1009* (2013.01); *G01R 35/007* (2013.01); *H03M 1/069* (2013.01); *H03M 1/66* (2013.01)

(58) Field of Classification Search
  CPC ......... H03M 1/009; H03M 1/069; H03M 1/66
  USPC ................. 341/120, 118, 155, 144, 172, 153
  See application file for complete search history.

(56) References Cited

U.S. PATENT DOCUMENTS

| | | | |
|---|---|---|---|
| 5,870,052 A | 2/1999 | Dedic et al. | |
| 8,081,025 B1 | 12/2011 | Li | |
| 8,284,093 B2 | 10/2012 | Kawai | |
| 8,823,563 B1 | 9/2014 | Ransun | |
| 8,947,067 B1 | 2/2015 | Zarei | |
| 9,473,162 B2 | 10/2016 | Girardi et al. | |
| 9,508,420 B1 | 11/2016 | Hunt-Schroeder et al. | |
| 2005/0275578 A1* | 12/2005 | Bjornsen | H03M 1/0641 341/155 |
| 2010/0079327 A1* | 4/2010 | Berens | H03M 1/0682 341/158 |
| 2016/0182077 A1 | 6/2016 | Maddox et al. | |
| 2017/0126240 A1 | 5/2017 | Wen et al. | |

* cited by examiner

*Primary Examiner* — Peguy Jean Pierre
(74) *Attorney, Agent, or Firm* — Gibb & Riley, LLC; Michael J. LeStrange, Esq.

(57) ABSTRACT

Disclosed is a calibration circuit and method. The circuit includes: a DAC that outputs an analog parameter and includes output parameter adjustment circuitry; a comparator that receives a reference parameter and the analog parameter; and a control circuit (with select logic) connected to the comparator and DAC in a feedback loop. During a calibration mode, the magnitude of the analog parameter is adjusted by ½ DAC step in one direction and the feedback loop is used to perform a binary search calibration process. During an operation mode, the magnitude of the analog parameter is adjusted by ½ DAC step in the opposite direction. The select logic selects the DAC step identified by the calibration process or the next higher DAC step as a final DAC step. The control circuit outputs a final DAC code corresponding to the final DAC step and the DAC generates a calibrated parameter based thereon.

20 Claims, 9 Drawing Sheets

ON-CHIP CALIBRATION CIRCUIT AND METHOD WITH HALF-STEP RESOLUTION

BACKGROUND

Field of the Invention

The present invention relates to on-chip parameter calibration and, particularly, to a circuit and method for on-chip calibration with improved resolution.

Description of Related Art

Integrated circuits (ICs) often require the use of a reference parameter that is internally generated by an on-chip reference circuit (e.g., a reference voltage internally generated by a bandgap voltage reference circuit, a reference current generated by a current reference circuit, etc.). By design this reference parameter can be set at a specific level for optimal IC performance. However, chip-to-chip variations in this reference parameter can occur, due to process variations, temperature-induced variations, age-induced variations, etc. With device size scaling (e.g., to the 14 nanometer (nm) technology node, the 7 nm technology node, and beyond) these chip-to-chip variations in the reference parameter can be relatively large. For example, chip-to-chip variations in a reference voltage can be as high as or even higher than 100 millivolts (mV). Thus, calibration of the reference parameter is often required. Calibration refers to a process of adjusting a reference parameter so that the resulting calibrated parameter falls within an acceptable range. Currently used calibration techniques can, however, be time consuming and thereby costly. For example, in order to compensate for chip-to-chip variations in a reference voltage, designers often use a programmable resistor array for at least one of the resistors in the bandgap voltage reference circuit. In this case, a reference voltage at the output of the bandgap voltage reference circuit is measured and, depending upon the value of that reference voltage, one or more of the programmable resistors can be programmed to adjust the value of the reference voltage at the output such that the resulting calibrated voltage falls within an acceptable voltage range. The process of measuring the reference voltage and programming resistors to generate a calibrated voltage can be time consuming and thereby costly as the resolution is increased (more bits). Self-calibration circuits have recently been developed in order to reduce the calibration time. However, with such self-calibration circuits there is generally a significant trade-off between the circuit features that enable quick calibration and the circuit features that enable high-resolution calibration.

SUMMARY

In view of the foregoing, disclosed herein are embodiments of an on-chip calibration circuit configured to perform a binary search calibration process with respect to a reference parameter and to also provide additional calibration resolution (e.g., an additional half DAC step of resolution) using post-calibration processing. By using post-calibration processing, improved calibration resolution can be achieved without a corresponding increase in calibration time. Also disclosed herein are embodiments of a corresponding calibration method.

More particularly, disclosed herein are embodiments of an on-chip calibration circuit for calibrating a reference parameter. This calibration circuit can include: an N-bit digital-to-analog converter (DAC) that outputs an analog parameter and that includes output parameter adjustment circuitry; a comparator that receives a reference parameter and the analog parameter; and a control circuit operably connected to the comparator and the DAC in a feedback loop. The calibration circuit also includes DAC step select logic, which is either incorporated into or in communication with the control circuit.

The calibration circuit is selectively operable in either a calibration mode or an operation mode. During the calibration mode, the output parameter adjustment circuitry automatically adjusts the magnitude of the analog parameter by approximately a half DAC step (i.e. half the Least Significant Bit (LSB) DAC step) in a first direction (e.g., automatically increases the magnitude of the analog parameter by a half DAC step). Additionally, the control circuit uses the feedback loop to perform a calibration process in order to identify a provisional DAC step. During the operation mode, the output parameter adjustment circuitry automatically adjusts the magnitude of the analog parameter by a half DAC step in a second direction opposite the first direction (e.g., automatically decreases the magnitude of the analog parameter by a half DAC step). Additionally, the DAC step select logic selects either the provisional DAC step, which was previously identified during the calibration process, or an adjacent DAC step (e.g., a next higher DAC step) as the final DAC step for post-calibration operational use. Then, the control circuit outputs a final DAC code corresponding to the final DAC step and the DAC generates a calibrated parameter in response to the final DAC code. The final DAC step selected by the DAC step select logic will be that DAC step that is statistically most likely to result in a calibrated parameter closest in value to a target parameter given the ½ DAC step change in the analog parameter during the operation mode.

One particular embodiment of the calibration circuit can be employed for voltage calibration. Specifically, this calibration circuit can include an N-bit digital-to-analog converter (DAC) that outputs an analog voltage and that has output voltage adjustment circuitry; a voltage comparator that receives a reference voltage and the analog voltage; and a control circuit operably connected to the voltage comparator and the DAC in a feedback loop. The calibration circuit can also include DAC step select logic, which is either incorporated into or in communication with the control circuit.

This calibration circuit can be selectively operable in either a calibration mode or an operation mode. During the calibration mode, the output voltage adjustment circuitry automatically increases the magnitude of the analog voltage by approximately a half DAC step (i.e. half the Least Significant Bit (LSB) DAC step). The control circuit then uses the feedback loop to perform a binary search calibration process in order to identify a provisional DAC step. During the operation mode, the output voltage adjustment circuitry automatically decreases the magnitude of the analog voltage by approximately a half DAC step. Additionally, the DAC step select logic selects either the provisional DAC step, which was previously identified during the calibration process, or a next higher DAC step as the final DAC step for post-calibration operational use. Then, the control circuit outputs a final DAC code corresponding to the final DAC step and the DAC generates a calibrated voltage in response to the final DAC code. The final DAC step selected by the DAC step select logic will be that DAC step that is statistically most likely to result in a calibrated voltage that is closest in value to a target voltage given the ½ DAC step decrease in the magnitude of the analog voltage during the operation mode.

Also disclosed herein are embodiments of a corresponding calibration method. The method can include providing a calibration circuit, as described above. That is, the provided calibration circuit can include: an N-bit digital-to-analog converter (DAC) that outputs an analog parameter and that has output parameter adjustment circuitry; a comparator that receives a reference parameter and the analog parameter; and a control circuit operably connected to the comparator and the DAC in a feedback loop. The calibration circuit also includes DAC step select logic, which is either incorporated into or in communication with the control circuit.

The method can further include selectively operating the calibration circuit in either a calibration mode or an operation mode. Operating the calibration circuit in the calibration mode includes automatically adjusting, by the output parameter adjustment circuitry, a magnitude of the analog parameter by approximately a half DAC step (i.e. half the Least Significant Bit (LSB) DAC step) in a first direction (e.g., automatically increasing the analog parameter by a half DAC step). Operating the calibration circuit in the calibration mode further includes using, by the control circuit, the feedback loop to perform a binary search calibration process in order to identify a provisional DAC step. Operating the calibration circuit in the operation mode includes automatically adjusting, by the output parameter adjustment circuitry, the magnitude of the analog parameter by approximately a half DAC step in a second direction opposite the first direction (e.g., automatically decreasing the magnitude of the analog parameter by a half DAC step). Operating the calibration circuit in the operation mode also includes selecting, by the DAC step select logic, either the provisional DAC step or an adjacent DAC step (e.g., the next higher DAC step) as a final DAC step for post-calibration operational use; outputting, by the control circuit, a final DAC code corresponding to the final DAC step; and generating, by the DAC, a calibrated parameter in response to the final DAC code. The final DAC step selected by the DAC step select logic will be that DAC step that is statistically most likely to result in a calibrated parameter closest in value to a target parameter given the ½ DAC step adjustment the magnitude of the analog parameter.

It should be noted that in the calibration circuit and method embodiments described above, when the calibration circuit is operated in the calibration mode the magnitude of the analog parameter (e.g., the analog voltage) output by the DAC is adjusted by approximately a half DAC step, the DAC would ideally be centered around the target so that the binary search calibration process would ideally calibrate to the midpoint. That is, since the calibration mode moves the voltage being calibrated by a half DAC step, the middle DAC step (i.e., the midpoint voltage) should be centered at the reference voltage in order to calibrate with the highest degree of accuracy.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, integrated circuits (ICs) often require the use of a reference parameter that is internally generated by an on-chip reference circuit (e.g., a reference voltage internally generated by a bandgap voltage reference circuit, a reference current generated by a current reference circuit, etc.). By design this reference parameter can be set at a specific level for optimal IC performance. However, chip-to-chip variations in this reference parameter can occur, due to process variations, temperature-induced variations, age-induced variations, etc. With device size scaling (e.g., to the 14 nm technology node, the 7 nm technology node, and beyond) these chip-to-chip variations in the reference parameter can be relatively large. For example, chip-to-chip variations in a reference voltage can be as high as or even higher than 100 mV. Thus, calibration of the reference parameter is often required. Calibration refers to a process of adjusting a reference parameter so that the resulting calibrated parameter falls within an acceptable range and particularly within an acceptable distance from a target. Currently used calibration techniques can, however, be time consuming and thereby costly. For example, in order to compensate for chip-to-chip variations in a reference voltage, designers often use a programmable resistor array for at least one of the resistors in the bandgap voltage reference circuit. In this case, a reference voltage at the output of the bandgap voltage reference circuit is measured and, depending upon the value of that reference voltage, one or more of the programmable resistors can be programmed to adjust the value of the reference voltage at the output such that the resulting calibrated voltage is closer to the target voltage for that reference voltage. The process of measuring the reference voltage and programming resistors to generate a calibrated voltage closer to the target voltage can be time consuming and thereby costly as the resolution is increased (more bits). Self-calibration circuits have recently been developed in order to reduce the calibration time. However, with such self-calibration circuits there is generally a significant trade-off between the circuit features that enable quick calibration and the circuit features that enable high-resolution calibration.

Figure 1:
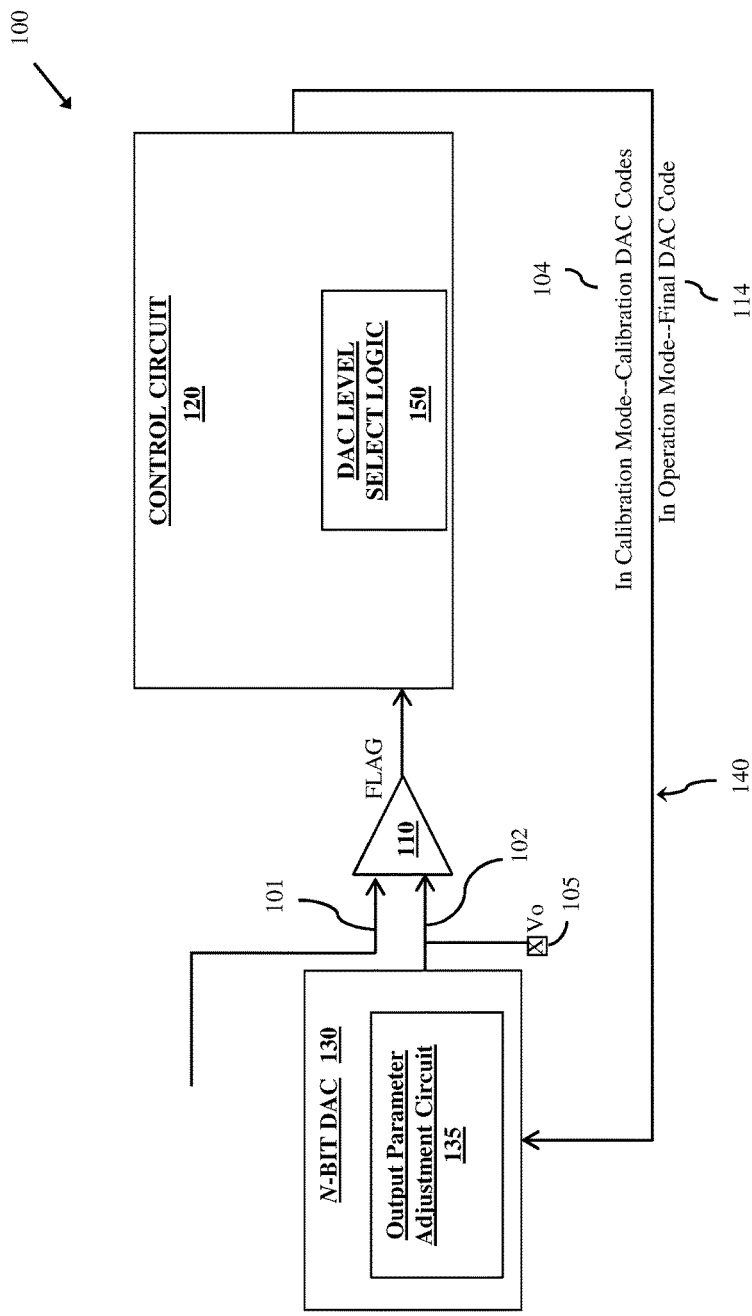
FIG. 1 is a schematic diagram illustrating an on-chip calibration circuit.

Referring to FIG. 1, generally disclosed herein are embodiments of an on-chip calibration circuit 100 for calibrating a reference parameter 101, which is generated, for example, by an on-chip reference circuit (not shown), so that the resulting calibrated parameter at an output node 105 will be within a half digital-to-analog converter (DAC) step of a target value for the reference parameter. The reference parameter 101 could be any reference parameter (e.g., voltage, current, temperature, pressure, frequency, timing, etc.) generated by a suitable reference circuit.

In each of the embodiments, the calibration circuit 100 can include a digital-to-analog converter (DAC) 130 that outputs an analog parameter 102 and that has output parameter adjustment circuitry 135; a comparator 110 that receives the reference parameter 101 and the analog parameter 102; and a control circuit 120 operably connected to the DAC 130 and to the comparator 110 in a feedback loop 140. The calibration circuit 100 can also include DAC step select logic 150, which is either incorporated into the control circuit 120 (as illustrated) or in communication with the control circuit 120.

This calibration circuit 100 can be selectively operated in either a calibration mode or an operation mode.

During the calibration mode, the output parameter adjustment circuitry 135 of the DAC 130 can be selectively activated by the control circuit 120 to automatically adjust the magnitude of the analog parameter 102 output by the DAC 130 by approximately (and ideally by exactly) a half DAC step (i.e. half the Least Significant Bit (LSB) DAC step) in a first direction. For example, in the embodiment described and illustrated in the figures, the magnitude of the analog parameter 102 can be automatically increased by approximately (and ideally by exactly) a half DAC step in the calibration mode. Alternatively, the magnitude of the analog parameter 102 could be automatically decreased by approximately (and ideally by exactly) a half DAC step in the calibration mode.

The control circuit 120 can then use the feedback loop 140 to perform a calibration process in order to determine if the parameter being calibrated (i.e., adjusted to closely mirror the reference parameter) is within the calibration range of the calibration circuit 100 and to further identify a provisional DAC step closest to the target (i.e., the reference parameter 101) given the ½ DAC step adjustment (e.g., increase) in the analog parameter 102 during the calibration mode. This calibration process can be, for example, a binary search calibration process during which the reference parameter 101 is compared by the comparator 110 to a series of analog parameters, which are output by the DAC 130 in response to a series of different calibration DAC codes 104 from the control circuit 120. Based on the results of these comparisons, the control circuit 120 can determine if the parameter being calibrated is within the calibration range of the calibration circuit 100 and, if so, can identify a provisional DAC step. An analog parameter 102 generated by the DAC 130 during the calibration mode using a DAC code corresponding to this provisional DAC step will fall within a single DAC step of the target (i.e., of the value of the reference parameter 101). That is, the binary search calibration process performed during the calibration mode provides calibration resolution of one DAC step.

The embodiments disclosed herein further incorporate post-calibration processing to improve the calibration resolution and, specifically, to provide calibration resolution of ½ DAC step (i.e. half the Least Significant Bit (LSB) DAC step). Specifically, during the operation mode, the output parameter adjustment circuitry 135 of the DAC 130 can be selectively deactivated by the control circuit 120 to automatically adjust the magnitude of the analog parameter 102 output by the DAC 130 by approximately (and ideally by exactly) a half DAC step in a second direction opposite the first direction.

For example, in the embodiment described and illustrated in the figures, the magnitude of the analog parameter 102 can be automatically decreased by approximately (and ideally by exactly) a half DAC step in the operation mode. Alternatively, if the magnitude of the analog parameter 102 was automatically decreased by a half DAC step in the calibration mode, it could be automatically increased by a half DAC step in the operation mode.

Given the deactivation of the output parameter adjustment circuitry 135, the DAC step select logic 150 can select either the provisional DAC step, which was previously identified during the calibration process, or an adjacent DAC step as the final DAC step for post-calibration operational use. It should be understood that, when the magnitude of the analog parameter is increased by a half DAC step during the calibration mode and decreased by a half DAC step in the operation mode, the DAC step select logic 150 selects either the provisional DAC step or the next higher DAC step as the final DAC step for post-calibration operational use. That is, knowing that in response to the provisional DAC code, the analog parameter 102 output from the DAC 130 (and thereby the calibrated parameter at the output node 105 of the calibration circuit 100) will be a ½ DAC step lower during the operation mode than what it was during the calibration mode, a determination is made as to whether or not the final DAC step should be the provisional DAC step identified during the calibration process or the next higher DAC step. However, it should be understood that, if the magnitude of the analog parameter is decreased by a half DAC step during the calibration mode and increased by a half DAC step in the operation mode, the DAC step select logic 150 selects either the provisional DAC step or the next lower DAC step as the final DAC step for post-calibration use.

In any case, the control circuit 120 then outputs a final DAC code 114 corresponding to the final DAC step and, in response to the final DAC code 114, the DAC 130 generates a final analog parameter and, particularly, a calibrated parameter at the output node 105. It should be noted that the final DAC step selected by the DAC step select logic 150 will be that DAC step that is statistically most likely to result in a final analog parameter (i.e., a calibrated parameter) at the output node 105 that is closest in value to the target knowing that, during the operation mode, the final DAC code 114 will produce a final analog parameter that is adjusted by ½ DAC step (e.g., a half DAC step lower than what would have been achieved using the same DAC code during the calibration mode).

The reference parameter 101 can be, for example, a known, fixed, reference voltage. Such a reference voltage can be, for example, generated by a bandgap voltage reference circuit or by a resistor divider network from a known power supply voltage. Alternatively, the reference parameter 101 could be any known, fixed, reference parameter (e.g., a known, fixed current, temperature, pressure, frequency, timing, etc.) generated by a suitable reference circuit.

For purposes of illustration, a voltage calibration circuit 200 specifically configured to calibrate a a voltage output from a digital-to-analog converter (DAC) 230 is described in greater detail below and illustrated in FIG. 2. For purposes of illustration, this particular embodiment of a voltage calibration circuit provides for a half DAC step increase in the voltage during the calibration mode and a half DAC step decrease in the voltage during the operation mode. However, it should be understood that embodiments of a voltage calibration circuit that provide a half DAC step decrease in the voltage during the calibration mode and a half DAC step increase in the voltage during the operation mode are also anticipated.

In any case, this calibration circuit 200 can include a digital-to-analog converter (DAC) 230 that outputs an analog voltage 202 and that has output voltage adjustment circuitry 235. The calibration circuit 200 can further include a voltage comparator 210 that receives a known, fixed, reference voltage 201 (e.g., 600 mV) and the analog voltage 202. The calibration circuit 200 can further include a control circuit 220, which includes, for example, a tester 225 (e.g., a built-in self-test engine with test pins), a binary adder/subtractor 221 and a shift register 222 in communication with both the tester and the binary adder/subtractor 221 and which is operably connected to the DAC 230 and to the voltage comparator 210 in a feedback loop 240. The calibration circuit 200 can also include DAC step select logic 250, which is either incorporated into or in communication with the control circuit 220 (as illustrated).

During the calibration mode, the output voltage adjustment circuitry 235 of the DAC 230 can be selectively activated by the control circuit 220 to automatically increase the magnitude of the analog voltage 202 output by the DAC 230 by approximately (and ideally by exactly) a half DAC step (i.e. half the Least Significant Bit (LSB) DAC step). The control circuit 220 can then use the feedback loop 240 to perform a calibration process and, particularly, a binary search calibration process in order to determine whether the voltage being calibrated is within a calibration range of the calibration circuit 200 and to further identify a provisional DAC step that is closest to the target (i.e., to the reference voltage 201) given the ½ DAC step increase in the analog voltage 202 during the calibration mode. During this binary search calibration process, the reference voltage 201 (e.g., 600 mV) is compared by the comparator 210 to a series of analog voltages 202, which are output by the DAC 230 in response to a series of different calibration DAC codes 204 from the control circuit 220. Based on the results of these comparisons, the control circuit 220 can determine if the voltage being calibrated is within the calibration range of the calibration circuit 200 and, if so, can further identify the provisional DAC step. An analog voltage 202 generated by the DAC 230 during the calibration mode using a DAC code corresponding to this provisional DAC step will fall within a single DAC step of the target (i.e., of the reference voltage 201). That is, the binary search calibration process performed during the calibration mode provides calibration resolution of one DAC step.

The embodiments disclosed herein further incorporate post-calibration processing to improve the calibration resolution and, specifically, to provide calibration resolution of ½ DAC step. Specifically, during the operation mode, the output voltage adjustment circuitry 235 of the DAC 230 can be selectively deactivated by the control circuit 220 to automatically decrease the magnitude of the analog voltage 202 output by the DAC 230 by approximately (and ideally by exactly) a half DAC step (i.e. half the Least Significant Bit (LSB) DAC step). Given the deactivation of the output voltage adjustment circuitry 235, the DAC step select logic 250 selects either the provisional DAC step, which was previously identified during the calibration process, or the next higher DAC step as the final DAC step for post-calibration operational use. That is, knowing that in response to the provisional DAC code, the analog voltage 202 output from the DAC 230 (and thereby the calibrated voltage at the output node 205 of the calibration circuit 200) will be a ½ DAC step lower during the operation mode than what it was during the calibration mode, a determination is made as to whether or not the final DAC step should be the provisional DAC step identified in the last cycle of the binary search calibration process or the next higher DAC step. Then, the control circuit 220 outputs a final DAC code 214 corresponding to the final DAC step and, in response to the final DAC code 204, the DAC 230 generates a final analog voltage and, particularly, a calibrated voltage (Vo) at the output node 205. It should be noted that the final DAC step selected by the DAC step select logic 250 will be the DAC step that is statistically most likely to result in a final analog voltage (i.e., a calibrated voltage (Vo) at the output node 205) that is closest in value to a target voltage knowing that, during the operation mode, the final DAC code 214 will produce a final analog voltage that is ½ DAC step lower than what would have been achieved using the same DAC code during the calibration mode.

Specifically, in the calibration circuit 200, the reference voltage 201 can be generated, for example, by an on-chip band gap reference voltage circuit or a resistor divider network from a known power supply voltage (not shown), which is optionally configured to generate multiple band gap reference voltages of different values (e.g., $V_{REF1-REFN}$). Such band gap reference voltage circuits are well known in the art and, thus, the details have been omitted from this specification in order to allow the reader to focus on the salient aspects of the disclosed embodiments.

The DAC 230 can be configured to output an analog voltage 202 to the comparator 210 and the magnitude of that analog voltage 202 can vary depending upon the DAC code received by the DAC 230 from the control circuit 220 and further on whether or not the output voltage adjustment circuitry 235 has been activated or not. Those skilled in the art will recognize that, generally, the magnitude of the analog voltage from a DAC will be within some predetermined voltage range (Vrange) from a minimum voltage (Vmin) to a maximum voltage (Vmax) wherein the midpoint is the target (i.e., the reference voltage, for example, 600 mV) when the calibration circuit 200 is in the calibration mode and the output voltage adjustment circuitry 235 is activated (as discussed in greater detail below) and where the minimum and maximum voltage represent the maximum expected variation on the voltage. Various possible magnitudes for the analog voltage will typically be set at uniform DAC steps (also referred to herein as DAC levels) across this voltage range with each DAC step corresponding to a different DAC code (i.e., with each DAC step being output by the DAC in response to a different DAC code).

Those skilled in the art will recognize that the number (N) of bits in the DAC code will define the number of different DAC steps achievable by the DAC. Specifically, an N-bit DAC code will provide $2^{(N)}$ DAC steps. Thus, for example, as illustrated in the graph and table, respectively, of FIGS. 3A and 3B, a 4-bit DAC gives $2^4$ (or 16) DAC steps and is thereby configured to output 16 different output analog voltages 202, which are stepped (e.g., at 5 mV steps) across a given voltage range (Vrange). In order to select any one of the steps shown in FIGS. 3A-3B, a 4-bit DAC code would be required. Eight or less DAC steps would require a lesser number of bits and more than sixteen DAC steps would require a greater number of bits than four. Consequently, the magnitude of the output voltage of a DAC at DAC step 1 in response to DAC code "0001" will be a full DAC step (e.g., 5 mV) less than the magnitude of the output voltage of the DAC at DAC step 2 in response to DAC code "0010"; the magnitude of the output voltage of the DAC at DAC step 2 in response to DAC code "0010" will be a full DAC step (e.g., 5 mV) less than the magnitude of the output voltage of the DAC 130 at DAC step 3 in response to DAC code "0011"; and so on.

Prior to entering the calibration mode the output voltage adjustment circuitry 235 will not be activated and Vrange will be set at some Vmin to Vmax. When the output voltage adjustment circuitry 235 is activated during the calibration mode, Vrange will shift upward by one-half of a DAC step and, as a result, so will the different analog voltages at the different DAC steps. For example, Vrange can be 557.5 mV-632.5 mV (with a midpoint of 597.5 mV) and the DAC steps can be at every 5 mV across Vrange. When the output adjustment circuitry 235 is activated, Vrange can shift upward by 2.5 mV to 560 mV-635 mV (with a midpoint of 600 mV, which is equal to the target) and each DAC step within that Vrange will also be shifted upward (e.g., increased by 2.5 mV or ½ DAC step). When the output adjustment circuitry 235 is subsequently deactivated during the operation mode, Vrange can shift back downward by 2.5 mV (e.g., Vrange will go back to 557.5 mV-632.5 mV) and each DAC step within that Vrange can also be shifted back downward (e.g., decreased by 2.5 mV).

Figures 3A, 3B:
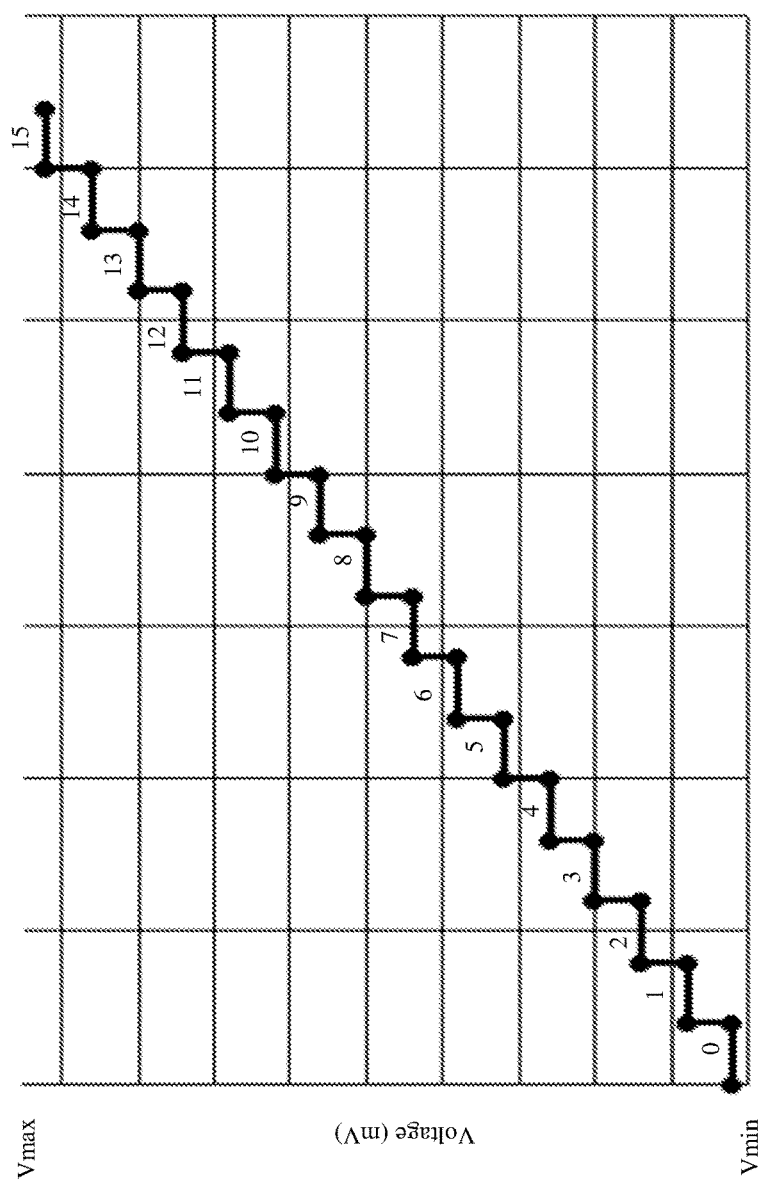
FIGS. 3A and 3B are a graph and table, respectively, illustrating the steps of a 4-bit digital-to-analog converter (DAC)
Figure 4:
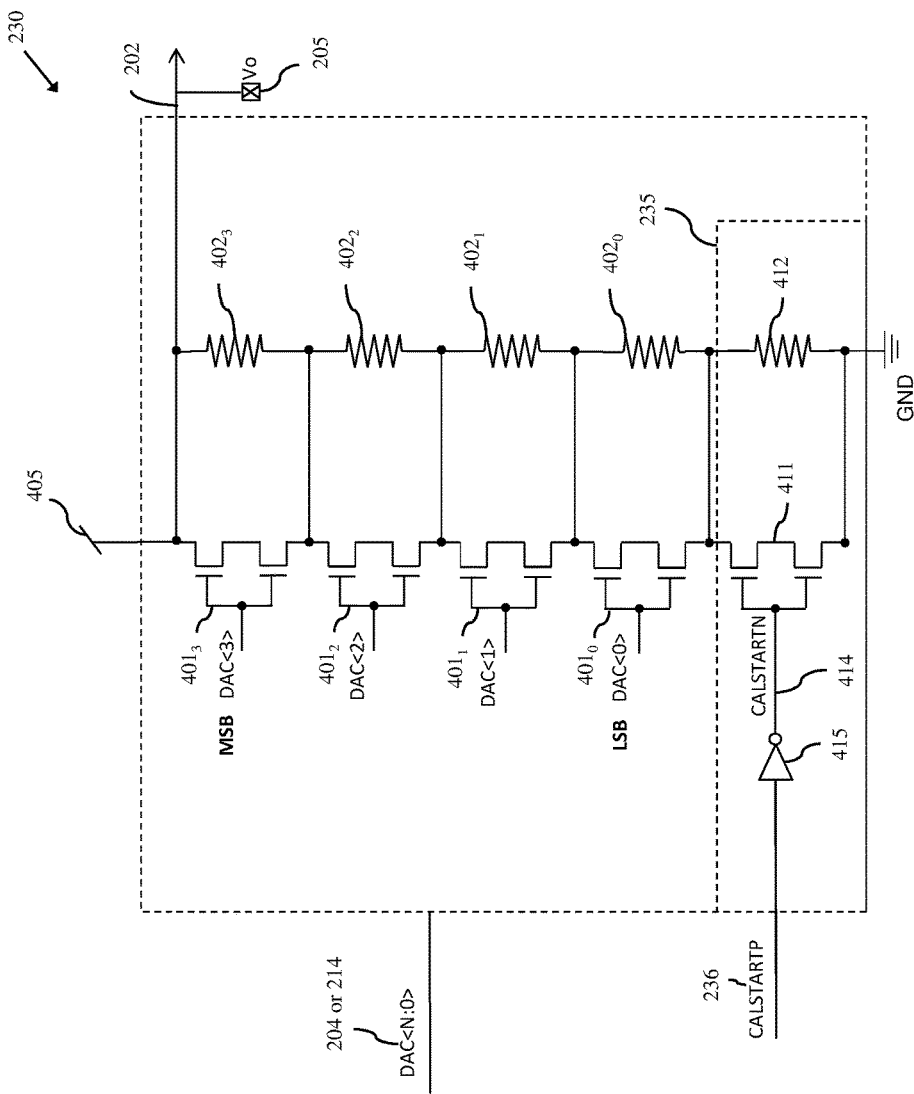
FIG. 4 is a schematic diagram illustrating an exemplary 4-bit DAC that can be incorporated into the on-chip calibration circuit of FIG. 2.

FIG. 4 is a schematic diagram illustrating an exemplary 4-bit DAC 230 configured to output different output voltages at the 0-15 DAC steps shown in FIGS. 3A-3B and further configured with output voltage adjustment circuitry 235 to automatically increase or decrease the output of the DAC by ½ DAC step depending upon the mode. Specifically, this exemplary DAC 230 includes the following components: four switches $401_{0-3}$ in the form of N-type field effect transistor (NFET) pairs coupled to a weighted resistor ladder network (e.g., see resistors $402_{0-3}$) and a positive voltage 405. The positive voltage 405 could, for example, be generated by a bandgap reference voltage circuit such that it is fixed and known (e.g., in the same manner as the reference voltage 201) or can be an internally generated voltage that varies from chip-to-chip and, thus, requires calibration as described above. Each switch $401_{0-3}$ can receive a corresponding one of the bits from the received DAC code, turning on the switch in the case of a "1" bit value and turning off the switch in the case of a "0" bit value. Depending upon the value of the different bits from the most significant bit (MSB) to the least significant bit (LSB), the magnitude of the analog voltage 202 output by the DAC 230 can be selectively varied (e.g., by 5 mV DAC steps across the full voltage range).

The output voltage adjustment circuitry 235 can include an inverter 415, which receives the mode select signal 236 (CALSTARTP) (e.g., from the tester 225). The output adjustment circuitry 235 can further include: an additional resistor 412 in the resistor ladder network and an additional switch 411, which is coupled to the additional resistor 412, connected in series to the switches $401_{0-3}$ and controlled by an on/off signal 414 (CALSTARTN) output from the inverter 415. In this configuration, a low mode select signal 236 will activate the output voltage adjustment circuitry 235 (during the operation mode) by causing the on/off signal 414 to go high and the additional switch 411 to turn on, thereby pulling down the analog voltage 202 (i.e., the calibrated voltage (Vo) at the output node 205). A high mode select signal 236 will deactivate the output adjustment circuitry 235 (during the calibration mode) by causing the on/off signal 414 to go low and the additional switch 411 to turn off, thereby pulling up the analog voltage 202 (i.e., the calibrated voltage (Vo) at the output node 205). It should be noted that the additional resistor 412 can be sized relative to the resistors $402_{0-3}$ such that, when the additional switch 411 is turned off, the calibrated voltage (Vo) at the output node 205 is pulled up by approximately (and ideally exactly) one-half of a DAC step and vice versa. One skilled in the art would recognize that, if a fixed current was injected into a resistor ladder with resistors that are binary weights of a resistance R, it will produce a linear step as the DAC increases from minimum to maximum. For example, if resistor $402_3$ is controlled by the DAC MSB and is set to resistance R, the resistor $402_2$ should be set to R/2, resistor $402_1$ should be set to R/4, and the LSB resistor $402_0$ should be set to R/8. Based on this, resistor 412 which is sized to add or subtract a ½ DAC step, it should be sized to R/16, where R represents the resistance associated with the MSB DAC resistor $402_3$.

As mentioned above, during the calibration mode (after the output adjustment circuitry 235 has been activated and the Vrange has been shifted upward), the control circuit 220 uses the feedback loop 240 to perform a binary search calibration process in order to determine if voltage being calibrated is within the calibration range of the calibration circuit 200 and, if so, to further identify a provisional DAC step and, particularly, to preliminarily identify a specific DAC step (and corresponding DAC code) that can be used by the DAC 230 to generate an analog voltage 202 closest in value to a target voltage.

Figure 5:
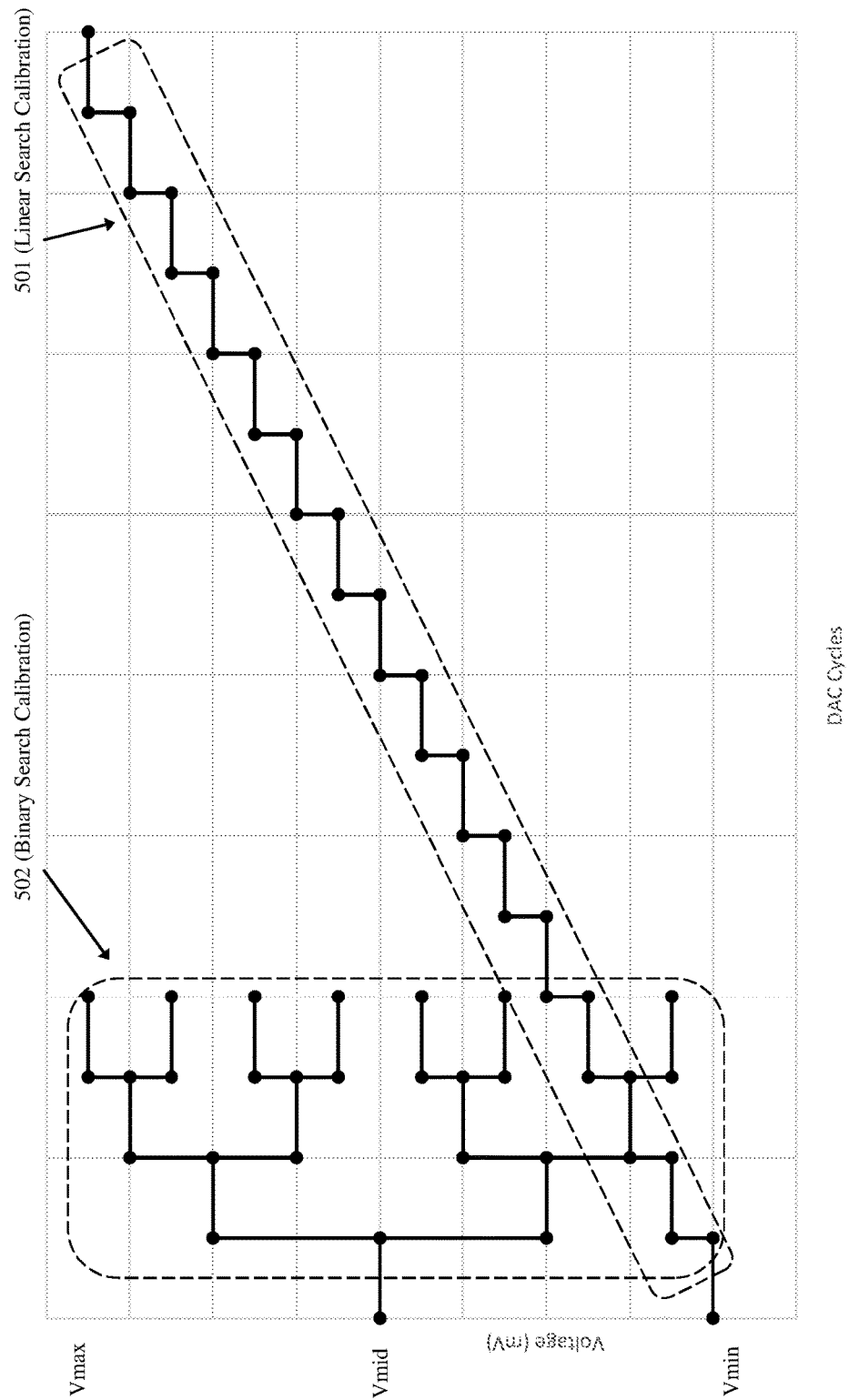
FIG. 5 is a graph illustrating a linear search tree and a binary search tree for a 4-bit DAC.

Those skilled in the art will recognize that a binary search calibration process significantly reduces the maximum possible number of cycles that may be required in order to identify an optimal DAC step. Specifically, in a conventional linear search calibration process, the analog voltage at each DAC step is compared in sequence (e.g., up or down) to the reference voltage in order to identify the DAC step that produces the calibration voltage closest in value to the reference voltage. In this case, the maximum possible number of cycles (comparisons by a comparator) is equal to the maximum number of DAC steps. Thus, as illustrated in the linear search tree 501 shown in FIG. 5, if a DAC has 0-15 DAC steps, 16 cycles may be required to complete the calibration. However, in a binary search calibration process, the reference voltage is first compared to a mid-point calibration voltage (Vmid) within the voltage range (Vrange). Based on the results of this comparison, the half of the range in which the reference voltage cannot lie is eliminated from further consideration and the search continues on the remaining half until it is successful. Thus, the number of cycles required to complete calibration is reduced to $\log_2(X)$, where X is the number of DAC steps. As illustrated in the binary search tree 502 shown in FIG. 5, for a 4-bit DAC with 0-15 steps, the number of cycles required to complete the calibration process is $\log_2(16)$ (i.e., 4 cycles).

Figure 2:
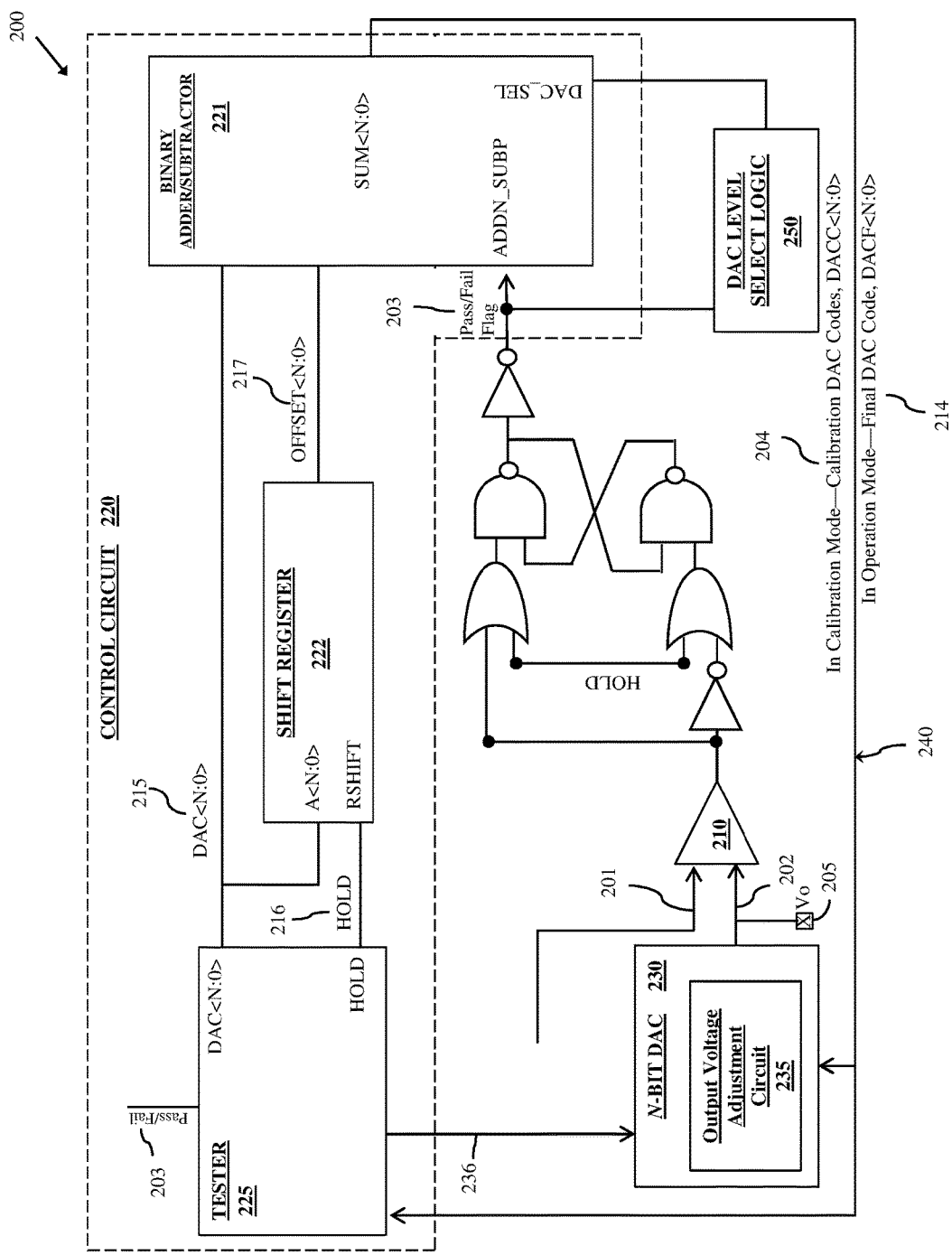
FIG. 2 is a schematic diagram illustrating one embodiment of an on-chip calibration circuit for voltage calibration.

More specifically, in the exemplary calibration circuit 200 structure shown in FIG. 2 the outputs of the tester 225 can include, but are not limited to, the following: the mode select signal 236 indicating the calibration mode or the operation mode; the set DAC level signal 215 (DAC<N:0>) (e.g., for a 4-bit DAC 230), and the HOLD signal 216 used to sample/hold the calibration result at each cycle in the calibration process after some finite amount of time/delay. The inputs to the tester 225 can include, but are not limited to, the following: the DAC code 204/214 output by the binary adder/subtractor 221 at each cycle in the calibration process during the calibration mode and during the operation mode; and the pass/fail flag 203 output at each cycle in the calibration process during the calibration mode and indicating the calibration result at each cycle.

To initiate the calibration mode, the control circuit 220 and particularly the tester 225 switches the mode select signal 236 from low to high to activate the output voltage adjustment circuitry 235 of the DAC 230, as discussed above.

Figure 6:
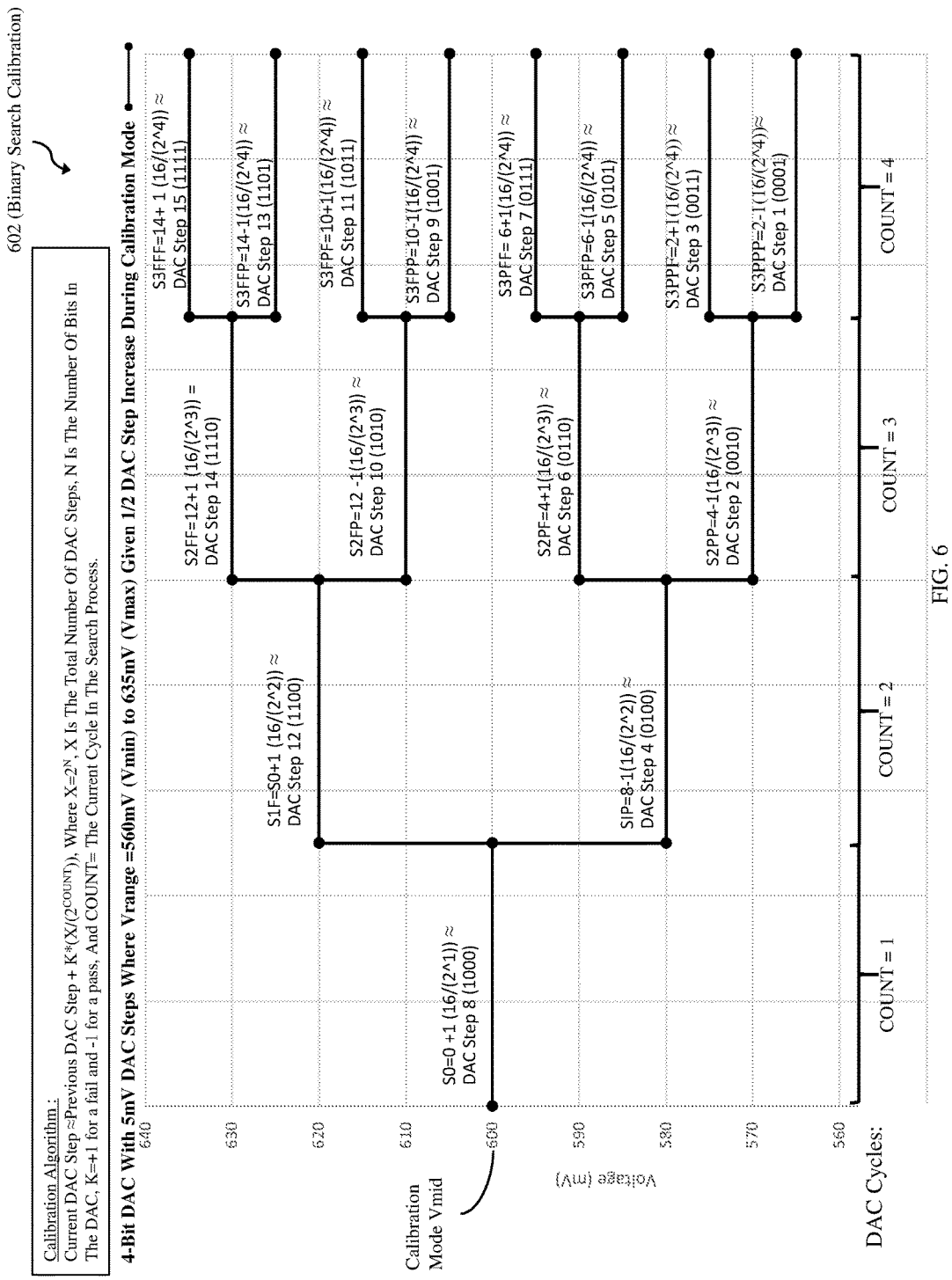
FIG. 6 is a graph illustrating an exemplary binary search tree and algorithm that can be employed by 4-bit DAC incorporated into the calibration circuit of FIG. 2 and operating in the calibration mode.

The binary search calibration process can then proceed, as discussed in detail below, with reference to the exemplary binary search calibration algorithm (decision tree) 602 shown in FIG. 6. As indicated in FIG. 6, this binary search algorithm provides the level of the DAC step in the current cycle will be the level of the DAC step in the previous cycle plus $K*(x/(2^{Count}))$. In this equation, X is the total number of DAC steps possible with the DAC at issue and is equal to $2^N$, where N is the number of bits in the DAC at issue (e.g., X=16 for a 4-bit DAC as illustrated). Additionally, in this equation, K will be either +1 (given a fail in the previous cycle) or −1 (given a pass in the previous cycle. Finally, in this equation Count is the number in the sequence for the current cycle binary search process (i.e. search cycle 1, search cycle 2, up to search cycle N for an N-bit DAC).

The control circuit 220, optionally, determines whether the voltage being calibrated is outside the calibration range of the calibration circuit 220.

To accomplish this, the tester 225 outputs a set DAC level signal 215 to initiate a preliminary cycle at the lowest DAC possible DAC level, thereby causing the adder/subtractor 221 to output a "0000" code (DAC step 0). The DAC 230 converts this "0000" code into an analog voltage 202. The comparator 210 compares the analog voltage 202 to the reference voltage 201 and outputs a pass/fail flag 203 with a value of "1" indicating a pass when the analog voltage 202 is higher than the reference voltage 201 and with a value of "0" indicating a fail when it is lower. A pass at this preliminary cycle indicates that the voltage being calibrated is outside the calibration range of the calibration circuit. Thus, the calibration process ends. A fail at this preliminary cycle indicates that the voltage being calibrated is above the minimum voltage of the range. Thus, the binary search calibration process can proceed.

Next, the tester 225 outputs a set DAC level signal 215 in order to set the DAC level for the first cycle at the middle DAC step. For example, using the above-mentioned algorithm, this first cycle DAC step can be DAC step 8 (e.g., $S0=0+1(16/(2^1))$). In response, the binary adder/subtractor 221 outputs a DAC code 204 corresponding to this middle DAC step and, specifically, a DAC code with a MSB at "1" and all remaining bits at "0" (i.e., "1000"). The DAC 230 converts this DAC code "1000" into an analog voltage 202 at the middle voltage (Vmid) (e.g., 600 mV) within the upshifted Vrange (e.g., 560-635 mV) assuming a 5 mV/step DAC. The comparator 210 compares the analog voltage 202 at this first cycle DAC step to the reference voltage 201 and outputs a pass/fail flag 203 with a value of "1" indicating a pass when the analog voltage 202 is higher than the reference voltage 201 and with a value of "0" indicating a fail when it is lower. As mentioned above, the pass/fail flag 203 is communicated back to the tester 225. After some delay, the tester 225 will set the HOLD signal 216 and check to see if the pass/fail flag 203 is a "1" (i.e., a pass) or a "0" (i.e., a fail).

In the event of a pass at the first cycle, all DAC steps above the middle DAC step are eliminated from further consideration. In the event of a fail at the first cycle, all DAC steps below the middle DAC step are eliminated from further consideration.

Given the pass/fail flag 203 from the first cycle, the control circuit 220 (employing the tester 225, the shift register 222 and the binary adder/subtractor 221) outputs a new DAC code 204 for the second cycle. In the DAC code 204 for the second cycle, the MSB will be a "1" if the pass/fail flag 203 from the first cycle indicates a pass and will be at "0" if the pass/fail flag 203 from the first cycle indicates a fail, the second MSB will be at "1" and all remaining bits will be at "0". More specifically, the tester 225 will hold DAC<3:0> at "1000" and the shift register 222 will right shift the "1" in the MSB by the count and insert a "0" in the MSB each time. For example, the shift register 222 takes "1000" and right shifts once to get "0100" as an offset value 217. This offset value 217 gets combined with the DAC<3:0> at "1000" in the binary adder/subtractor 221. Whether the offset value 217 is added to or subtracted from the DAC<3:0> at "1000" is determined by the value of the pass/fail flag 203 from the previous cycle. Thus, in the second cycle, if the pass/fail flag 203 from the first cycle was a "1", the offset value 217 is subtracted and the DAC code output from the adder/subtractor 221 becomes "0100" (8−4=4). However, if the pass/fail flag 203 from the first cycle was a "0", the offset value 217 is added and the DAC code output from the adder/subtractor 221 becomes becomes "1100". In other words, if the pass/fail flag 203 from the first cycle was a pass, then the DAC code for the second cycle will be "0100", which corresponds to DAC step 4 (i.e., $S1P=S0-1(16/(2^2))$). However, if pass/fail flag 203 from the first cycle was a fail, the DAC code for the second cycle will be "1100", which corresponds to DAC step 12 (i.e., $S1F=S0+1(16/(2^2))$). One skilled in the art would understand that the right shift operator can be used to add or subtract binary weights (powers of 2) to the previous DAC result. It should be understood that instead of using a shift register, any other suitable technique for generating the offset value 217 could be used.

The DAC 230 then converts the DAC code for the second cycle into a new analog voltage 202. The comparator 210 compares the new analog voltage 202 at this second cycle DAC step to the reference voltage 201 and outputs a new pass/fail flag 203 with a value of "1" indicating a pass when the new analog voltage 202 is higher than the reference voltage 201 and with a value of "0" indicating a fail when it is lower.

Given the pass/fail flags from the first and second cycles, the control circuit 220 (employing the tester 225, shift register 222 and binary adder/subtractor 221, as described above) outputs a new DAC code for the third cycle. In the DAC code for the third cycle, the MSB will be the same as that used in the second cycle, the second MSB will be "0" in the event of a second cycle pass and "1" in the event of a second cycle fail, the third MSB will be "1", and the least significant bit (LSB) will be "0". As a result, the DAC code for the third cycle could be any of the following: "0010" corresponding to DAC step 2 when the pass/fail flags from the first and second cycles were passes (i.e., $S2PP=S1P-1(16/(2^3))$); "0110" corresponding to DAC step 6 when the pass/fail flag from the first cycle was a pass and the pass/fail flag from the second cycle was a fail (i.e., $S2PF=S1P+1(16/(2^3))$); "1010" corresponding to DAC step 10 when the pass/fail flag from the first cycle was a fail and the pass/fail flag from the second cycle was a pass (i.e., $S2FP=S1F-1(16/(2^3))$); and "1110" corresponding to DAC step 14 when the pass/fail flags from the first cycle and the second cycle were fails (i.e., $S2FF=S1F+1(16/(2^3))$). The comparator 210 can compare the new analog voltage 202 at this third cycle DAC step to the reference voltage 201 and can output a new pass/fail flag 203 with a value of "1" indicating a pass when the analog voltage 202 is higher than the reference voltage 201 and with a value of "0" indicating a fail when it is lower.

Given the pass/fail flags from the first, second and third cycles, the control circuit 220 (again employing the tester 225, shift register 222 and binary adder/subtractor 221, as described above) can output a new DAC code for the fourth cycle. In the new DAC code for the fourth cycle, the MSB will be the same as that used in the second cycle, the second MSB will be the same as that used in the third cycle, the third MSB will be "0" in the event of a third cycle pass and "1" in the event of a third cycle fail, and the LSB will be "1". As a result, the new DAC code for the fourth cycle could be any of the following: "0001" corresponding to DAC step 1 when the pass/fail flags from the first, second and third cycles were passes (i.e., S3PPP=S2PP−1(16/($2^4$))); "0011" corresponding to DAC step 3 when the pass/fail flags from the first and second cycles were passes and the pass/fail flag from the third cycle was a fail (i.e., S3PPF=S2PP+1(16/($2^4$))); "0101" corresponding to DAC step 5 when the pass/fail flags from the first and third cycles were passes and the pass/fail flag from the second cycle was a fail (i.e., S3PFP=S2PF−1(16/($2^4$))); "0111" corresponding to DAC step 7 when the pass/fail flag from the first cycle was a pass and the pass/fail flags from the second and third cycles were fails (i.e., S3PFF=S2PF+1(16/($2^4$))); "1001" corresponding to DAC step 9 when the pass/fail flag from the first cycle was a fail and the pass/fail flags from the second and third cycles were passes (i.e., S3FPP=S2FP−1(16/($2^4$)); "1011" corresponding to DAC step 11 when the pass/fail flags from the first and third cycles were fails and the pass/fail flag from the second cycle was a pass (i.e., S3FPF=S2FP+1(16/($2^4$))); "1101" corresponding to DAC step 13 when the pass/fail flags from the first and second cycles were fails and the pass/fail flag from the third cycle was a pass (i.e., S3FFP=S2FF−1(16/($2^4$))); and "1111" corresponding to DAC step 15 when the pass/fail flags from the first, second and third cycles were fails (i.e., S3FFF=S2FF+1(16/($2^4$))).

In any case, the DAC code output by the control circuit 220 for the last cycle during the calibration mode (in this example, the DAC code selected for use in the fourth cycle of the binary search calibration process) will be the solution of the binary search calibration process and, particularly, will correspond to the provisional DAC step identified by the binary search calibration process. It should be noted that in order to determine the final DAC step that will be used in operation mode, as discussed below, a final comparison is made during the calibration mode between the reference voltage 201 and the analog voltage 202, which is output by the DAC 230 at the provisional DAC step (i.e., at the DAC step identified by the binary search operation) when the output voltage adjustment circuitry 235 is still activated to determine the pass/fail status. As discussed in greater detail below with regard to the operation mode, if the result is a pass, "1", the optimal DAC will be the provisional DAC step+1 as the one half step DAC will reduce the final voltage by ½ DAC step; whereas, if the result is a fail, "0", the optimal DAC will be the provisional DAC step.

Figure 7:
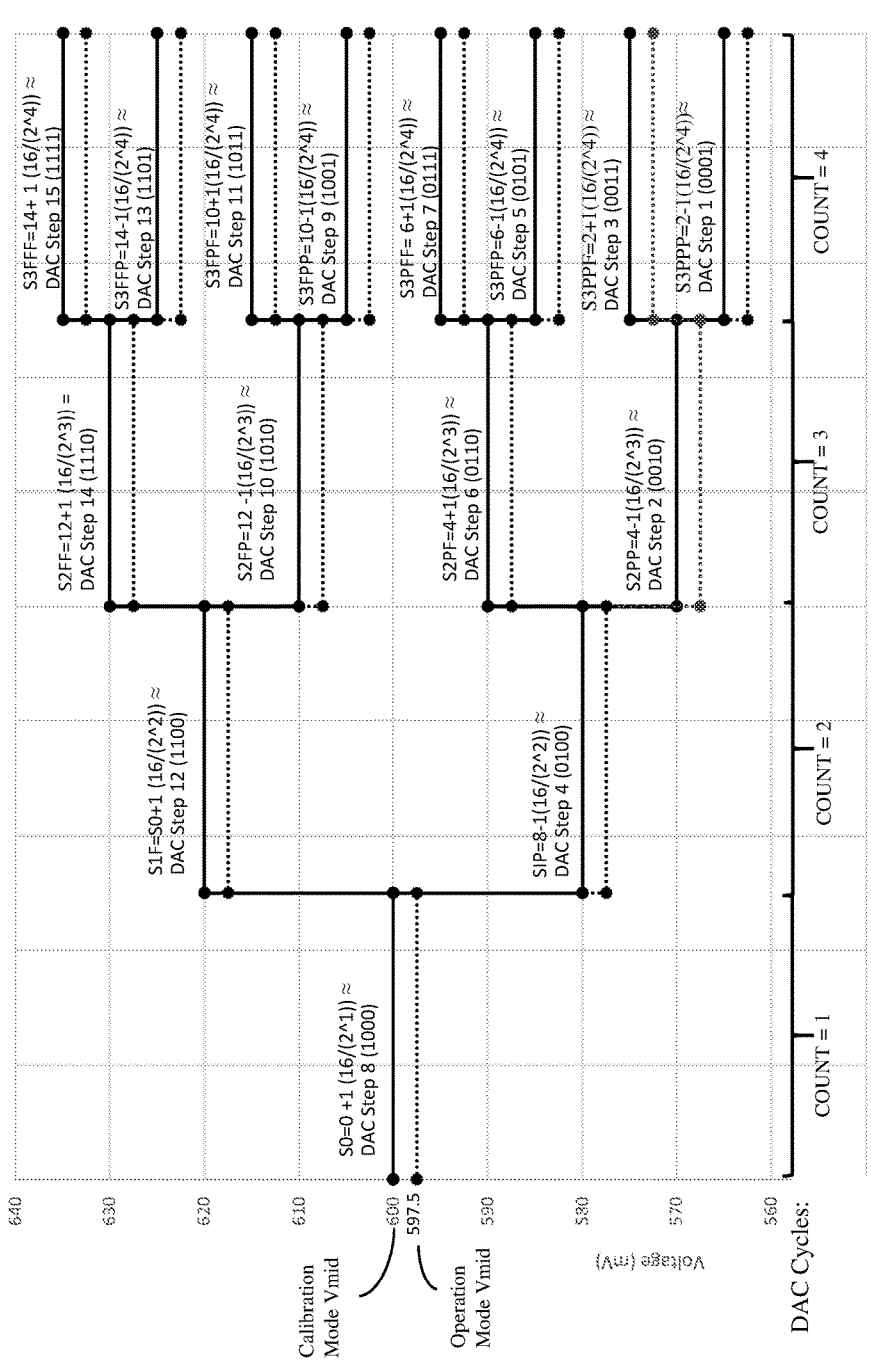
FIG. 7 is a graph illustrating the voltage drop associated with the 4-bit DAC incorporated into the calibration circuit of FIG. 2 and operating in the calibration mode.

Once the control circuit 220 completes the binary search calibration process, operation of the calibration circuit 200 switches from the calibration mode to the operation mode (e.g., the tester 225 can switch the value of the mode select signal 236 from low to high), thereby deactivating the output adjustment circuitry 235 of the DAC 230 so that the magnitude of any analog voltage output by the DAC 230 in response to any one of the DAC codes "0000" to "1111" will be automatically readjusted and, particularly, reduced by approximately (and ideally exactly) one half of DAC step (e.g., by 2.5 mV) from what it was during the calibration mode. FIG. 7 is a graph comparing the the analog voltage output by the DAC 230 at each of the DAC steps 0-15 when the output voltage adjustment circuitry 235 is activated during the calibration mode (as shown also in the binary search tree of FIG. 6) and when the output voltage adjustment circuitry 235 is deactivated during the operation mode. In this example, the Vrange shifts downward to 557.5 mV (Vmin) to 632.5 mV (Vmax) with Vmid being 597.5 mV.

During the operation mode, the DAC select logic 250 can perform post-calibration processing to provide an added half DAC step of calibration resolution. That is, the DAC step select logic 250 can determine the optimal final DAC step to be used for generating a final analog voltage (i.e., the calibrated voltage) for post-calibration operational use given the deactivation of the output voltage adjustment circuitry 235 during the operation mode (i.e., given that, during the operation mode, the final DAC code will cause the DAC 230 to generate a final analog voltage that is a ½ DAC step, e.g., 2.5 mV less, that what it would have been during the calibration mode).

Selection of the final DAC step is based on whether the comparison performed by the comparator 210 during the last cycle in the binary search calibration process (e.g., during the fourth cycle in the example provided) resulted in a pass/fail flag 203 with a value of "1" (i.e., a pass indicating that the reference voltage 201 was below the fourth cycle analog voltage output by the DAC 230) or in a pass/fail flag 203 with a value of "0" (i.e., a fail indicating that the reference voltage 201 was above the fourth cycle analog voltage output by the DAC 230). Given the value of the last pass/fail flag output during the calibration mode, the DAC step select logic 250 will select either the provisional DAC step, which was previously identified during the binary search calibration process, or the next higher DAC step as the final DAC step for post-calibration operational use. Specifically, when the last pass/fail flag output during the calibration mode is a pass, the DAC select logic 250 will select the provisional DAC step as the final DAC step because the half DAC step voltage shift downward in the operation mode will move the calibrated voltage (i.e., the final analog voltage from the DAC 230 at the output node 205) statistically closer to the reference voltage 201, which is now known to be below the provisional DAC step and above the next lower DAC step. Contrarily, when the final pass/fail flag output during the calibration mode is a fail, the DAC select logic 250 will select the next higher DAC step above the provisional DAC step as the final DAC step because the reference voltage 201 is now known to be between the provisional DAC step and the next higher DAC step. In this case, since the next higher DAC step (i.e. provisional DAC step+1) is selected, the half DAC step voltage shift downward during the operation mode moves the calibrated voltage (i.e., the final analog voltage from the DAC 230 at the output node 205) closer to the reference voltage 201; whereas, if the provisional DAC step were instead to be selected, the half DAC step voltage shift downward during the operation mode would actually move the calibrated voltage further away.

For example, referring to the graph of FIG. 7, consider the case where the provisional DAC step identified at the fourth cycle of a binary search calibration process was DAC step 7. When code "0111" corresponding to DAC step 7 is forwarded to the DAC 230, an analog voltage 202 of a magnitude S3PFF is generated and output to the comparator 210. The comparator 210 compares that fourth cycle analog voltage 202 to the reference voltage 201. If a pass is indicated, DAC step 7 is selected by the DAC step select logic 250 as the final DAC step during post-calibration processing because the half DAC step voltage shift downward in the operation mode will move the calibrated voltage at the output node 205 closer to the reference voltage 201, which is now known to be between DAC steps 6 and 7. If a fail is indicated, DAC step 8 is selected by the DAC step select logic 250 as the final DAC step because the reference voltage 201 is now known to be between DAC steps 7 and 8 so the half DAC step voltage shift downward in the operation mode will move the calibrated voltage at the output node 205 closer to the reference voltage 201. In other words, the final DAC step selected by the DAC step select logic 250 will be that DAC step that is statistically most likely to be closest to the target voltage, given the additional resolution achievable due to the output adjustment circuitry 235.

Figure 8:
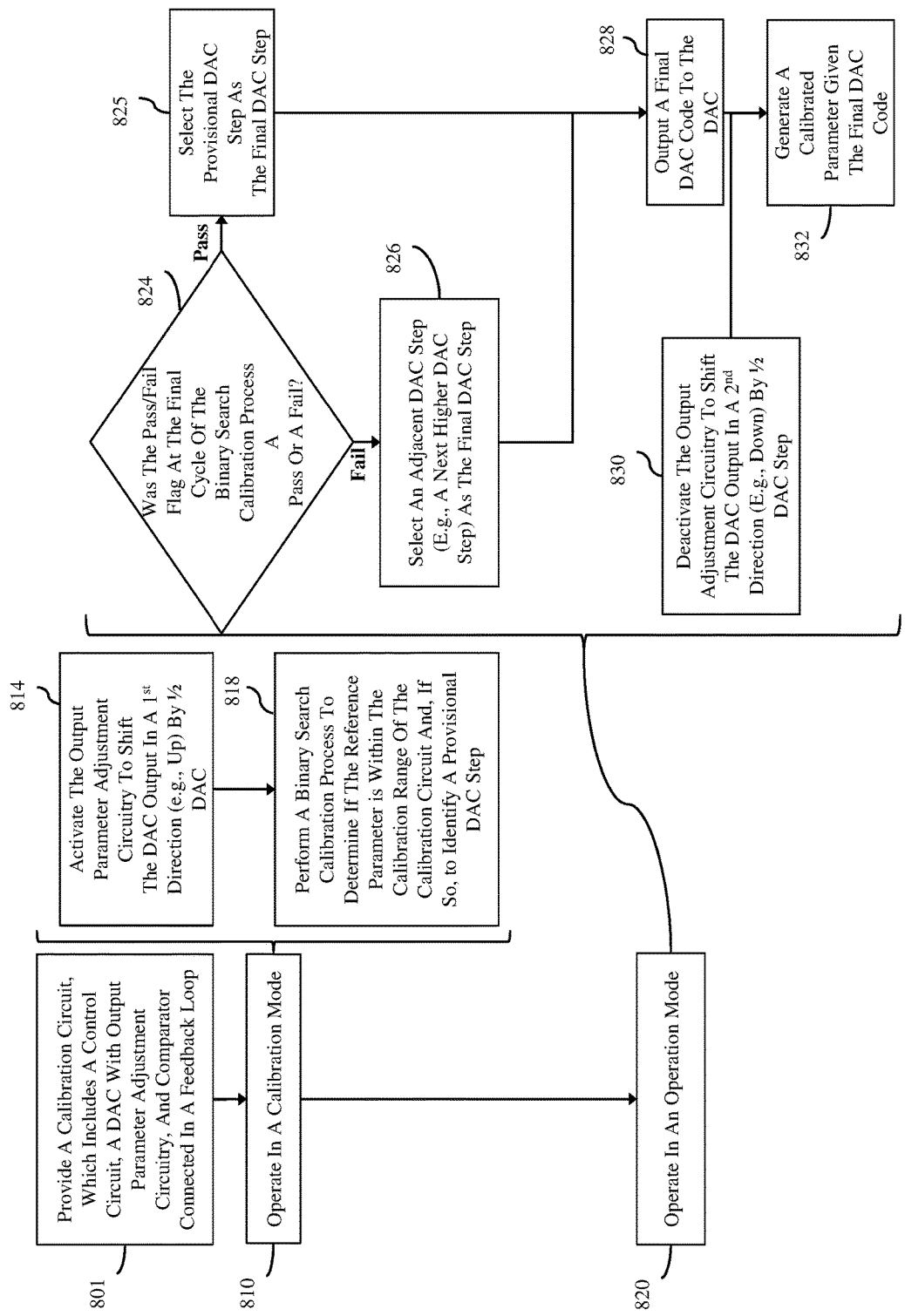
FIG. 8 is a flow diagram illustrating an on-chip calibration method.

Referring to the flow diagram of FIG. 8, also disclosed herein are embodiments of a calibration method. The method can include providing a calibration circuit (see the calibration circuits 100, 200 described in detail above and process 801). Specifically, the calibration circuit 100, 200 can include: an N-bit digital-to-analog converter (DAC) 130, 230 that outputs an analog parameter 102, 202 and that has output parameter adjustment circuitry 135, 235; a comparator 110, 210 that receives a reference parameter 101, 201 and the analog parameter 102, 202; and a control circuit 120, 220 operably connected to the comparator 110, 210 and the DAC 130, 230 in a feedback loop 140, 240. The calibration circuit 100, 200 can also include DAC step select logic 150, 250, which is either incorporated into or in communication with the control circuit. As mentioned above, the reference parameter and the analog parameter can be a reference voltage and an analog voltage, respectively (as shown specifically in the calibration circuit 200 of FIG. 2 and described in detail above). Alternatively, the reference parameter and the analog parameter can be any of other parameter that may require calibration (e.g., current, temperature, pressure, frequency, timing, etc.).

The method can further include selectively operating the calibration circuit 100, 200 in either a calibration mode (see process step 810) or an operation mode (see process step 820).

Operating the calibration circuit 100, 200 in the calibration mode at process step 810 can include activating, by the control circuit 120, 220, the output parameter adjustment circuitry 135, 235 in order to automatically adjust the magnitude of the analog parameter 102, 202 output by the DAC 130, 230 by approximately (and ideally by exactly) one half of DAC step (see process step 814).

For example, in the embodiment described and illustrated in the figures, the magnitude of the analog parameter 102, 202 can be automatically increased by approximately (and ideally by exactly) a half DAC step in the calibration mode. In this case, the magnitude of the analog parameter 102, 202 will be automatically decreased by approximately (and ideally by exactly) one half DAC step in the operation mode (see process step 830, discussed below) Alternatively, the magnitude of the analog parameter 102, 202 could be automatically decreased by approximately (and ideally by exactly) a half DAC step in the calibration mode at process 814 and automatically increased by approximately (and ideally by exactly) a half DAC step in the operation mode at process 830.

Operating the calibration circuit 100, 200 in the calibration mode can further include using, by the control circuit 120, 220 the feedback loop 140, 240 to perform a binary search calibration process in order to to determine if the parameter being calibrated is within the calibration range of the calibration circuit 100, 200 and, if so, to identify a provisional DAC step and, particularly, to preliminarily identify a specific DAC step (and corresponding DAC code) that can be used by the DAC 130, 230 to generate an analog parameter 102, 202 closest in value to the reference parameter 101, 201 (see process 818 and the exemplary binary search calibration process discussed in detail above with regard to FIGS. 3A-6).

Once the provisional DAC step is identified at process step 818, operation of the calibration circuit 100, 200 can be selectively switched from the calibration mode to the operation mode (see process step 820). Operating the calibration circuit 100, 200 in the operation mode can also include selecting, by the DAC step select logic 150, 250, either the provisional DAC step or an adjacent DAC step as a final DAC step for post-calibration operational use (see process steps 824-826).

For example, in an embodiment where a half DAC step increase in the analog parameter was provided during the calibration mode at process 814 and a half DAC step decrease in the analog parameter will be provided during the calibration mode at process 830, either the provisional DAC step or the next higher DAC step can be selected as the final DAC step.

Specifically, in this case, to select the final DAC step a determination is first made regarding whether a comparison performed by the comparator 110, 210 during the last cycle of the binary search calibration process at process step 818 resulted in a pass indicating that the reference parameter 101, 201 was below the last cycle analog parameter output by the DAC 130, 230 or in a fail indicating that the reference parameter 101, 201 was above the last cycle analog parameter output by the DAC 130, 230 (see process step 824). If it was a pass, the provisional DAC step will be selected as the final DAC step (see process step 825). If it was a fail, the next higher DAC step above the provisional DAC step will be selected as the final DAC step (see process step 826). It should, however, be noted that in an embodiment where a half DAC step decrease in the analog parameter was during the calibration mode at process 814 and a half DAC step increase in the analog parameter will be provided during the operation mode at process 830, either the provisional DAC step or the next lower DAC step will be selected as the final DAC step.

In any case, operating the calibration circuit 100, 200 in the operation mode further includes: outputting, by the control circuit 120, 220, a final DAC code 114, 214 corresponding to the final DAC step (see process step 828); deactivating, by the control circuit 120, 220 the output parameter adjustment circuitry 135, 235 so as to automatically decrease the magnitude of the analog parameter 102, 202 output by the DAC 130, 230 by approximately (and ideally exactly) one half of a DAC step (see process step 830) and then generating, by the DAC 130, 230 in response to the final DAC code 114, 214, a final analog parameter and, particularly, a calibrated parameter (e.g., a calibrated voltage) at the output node 105, 205 (see process step 832).

Figure 9:
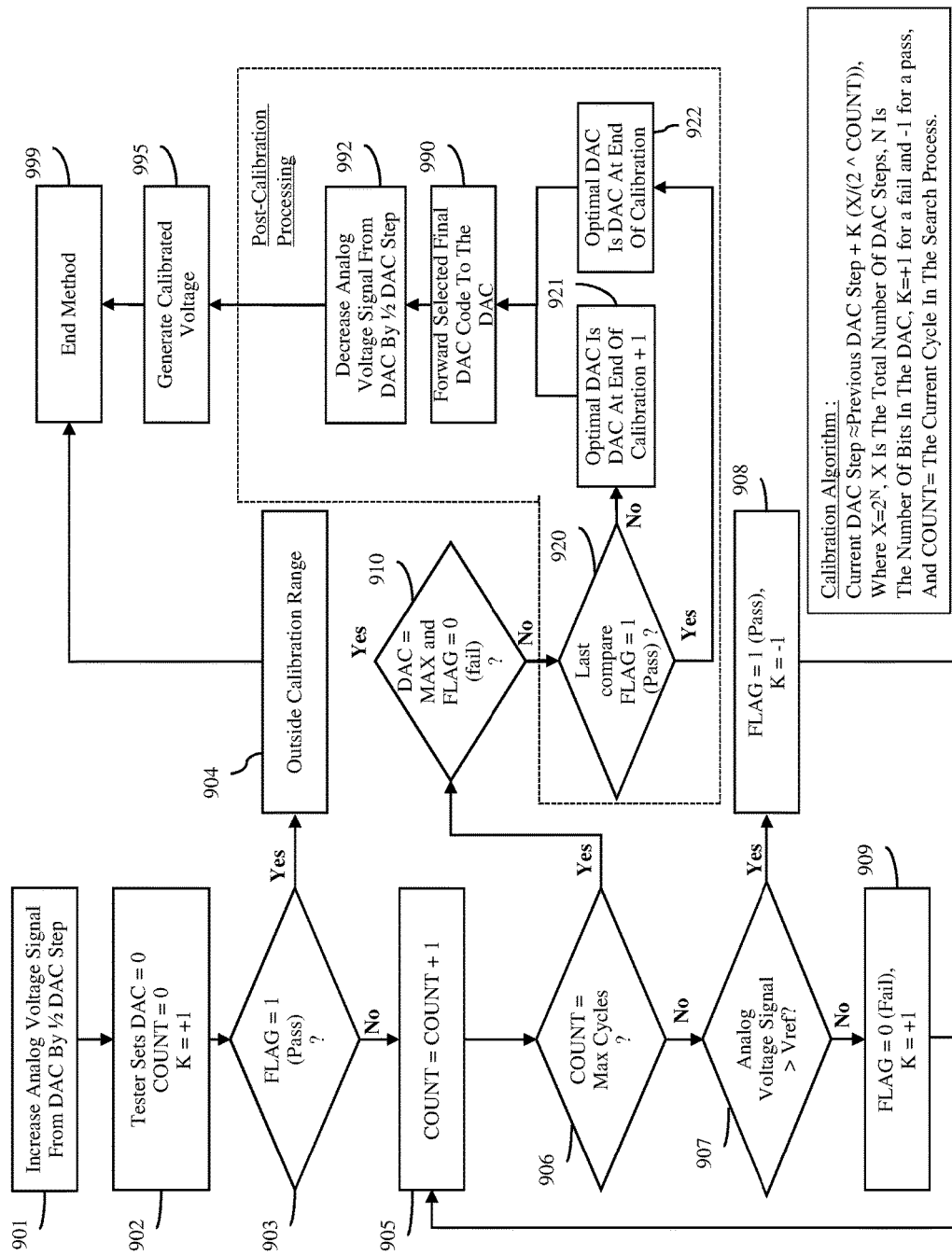
FIG. 9 is a flow diagram illustrating an embodiment of an on-chip calibration method for voltage calibration.

More particularly, referring to the flow diagram of FIG. 9 in combination with the voltage calibration circuit 200 of FIG. 2. For purposes of illustration, this particular embodiment of a voltage calibration method provides for a half DAC step increase in the voltage during the calibration mode and a half DAC step decrease in the voltage during the operation mode. However, it should be understood that embodiments of a voltage calibration method that provide a half DAC step decrease in the voltage during the calibration mode and a half DAC step increase in the voltage during the operation mode are also anticipated.

The calibration mode begins by activating the output voltage adjustment circuitry 235 to increase the analog voltage 202 output from the DAC 230 by approximately (and ideally exactly) one half of a DAC step (e.g., by 2.5 mV) (see process step 901).

To confirm whether voltage being calibrated is within the calibration range of the calibration circuit 200, the tester 225 sets the DAC 230 to the lowest DAC level (i.e., DAC step 0 with code "0000") (see process step 902). The analog voltage 202 output by the DAC 230 in response to the code "0000" is compared by the comparator 210 to the reference voltage 201 and the comparator 210 outputs a pass/fail flag 203 indicating the results of this comparison (see process step 903). If the pass/fail flag has a value of "1", which indicates a pass and, more particularly, indicates that the analog voltage 202 is above the reference voltage 201, the voltage being calibrated is determined to be outside the calibration range of the calibration circuit 200 (see process step 904). If so, no more processing is performed (see process step 999) and the IC chip can be discarded. If the pass/fail flag 203 has a value of "0", which indicates a fail and, more particularly, indicates that the analog voltage 202 is below the reference voltage 201, the voltage being calibrated is determined to be above the minimum voltage of the calibration range of the calibration circuit 200 and the binary search calibration process can proceed.

Assuming a pass/fail flag 203 with a value of "0", the count is incremented by 1 (see process step 905). The count refers to the cycle number. The minimum count is 0 at process step 902 and, because a binary search calibration process is being performed the maximum count is N (i.e., the maximum number of cycles in the binary search process is N, where N is the number of bits associated with the N-bit DAC 230). Incrementing the count at process step 905 will trigger a change in the DAC step according to the binary search calibration algorithm (e.g., see the binary search calibration algorithm/decision tree 602 shown in FIG. 6 and discussed in greater detail above). Next, the value of the count is checked to determine if the maximum count (i.e., the maximum number of cycles) has been reached (see process step 906).

If so, the binary search calibration process has been completed. If not, additional comparison cycle(s) are required. That is, as discussed in detail above with regard to the binary search calibration algorithm/decision tree 602, the binary search calibration process requires N compares for an N-bit DAC (which is a test time reduction when compared to a linear search). If the count is less then the limit of N, the analog voltage 202 generated by the DAC 230 in response to the current cycle DAC code is compared to the reference voltage 201 (see process step 907). If the analog voltage 202 generated by the DAC 230 in response to the current cycle DAC code is above the reference voltage 201, a pass/fail flag 203 with a value of "1" (pass) is output and K=−1 so that in the next cycle the DAC 230 will be set at a lower level according to the binary search calibration algorithm in order to move the analog voltage closer to the reference voltage (see process step 908). However, if the analog voltage 202 generated by the DAC 230 in response to the current cycle DAC code is below the reference voltage 201, a pass/fail flag 203 with a value of "0" (fail) is output and K=+1 so that in the next cycle the DAC 230 will be set at a higher level according to the binary search calibration algorithm in order to move the analog voltage closer to the reference voltage (see process step 909). The comparison processes continue at each new cycle until the maximum count (i.e., count=N) has been reached.

When at process step 906 it is determined that the maximum count has been reached (i.e., count=N), the binary search calibration process is complete. It should be noted that, if at count=N, the DAC is set at the highest DAC step (i.e., DAC=max) and the pass/fail flag 203 has a value of "0" (fail) indicating that reference voltage 201 is still above the analog voltage 202 (at the last cycle), the voltage being calibrated is still too low compared to the reference voltage 201 and a determination can be made that the voltage being calibrated is outside the calibration range (see process steps 910 and 904). If so, no more processing is performed (see process step 999) and the IC chip can be discarded.

Otherwise, the DAC step set for the last cycle of the binary search calibration process is a provisional DAC step, which may or may not be used for generating a calibrated voltage for post-calibration operational use. As mentioned above, an analog voltage 202 generated by the DAC 230 during the calibration mode using a DAC code corresponding to this provisional DAC step identified in the last cycle of the binary search calibration process will fall within a single DAC step of the reference voltage 201. That is, the binary search calibration process performed during the calibration mode provides calibration resolution of one DAC step. This provisional DAC step will be as close to the fixed and known reference voltage as possible given the number of bits provided.

Additional post-calibration processing can be performed in order to improve the calibration resolution and, particularly, in order to generate a calibrated voltage that is statistically more likely to be close to the target. Specifically, knowing that in response to the provisional DAC code, the analog voltage 202 output from the DAC 230 (and thereby the calibrated voltage at the output node 205 of the calibration circuit 200) will be a ½ DAC step lower during the operation mode than what it was during the calibration mode, a determination is made as to whether or not the final DAC step should be the provisional DAC step identified in the last cycle of the binary search calibration process or the next higher DAC step (see process steps 920-922). That is, a determination is made as to whether or not the pass/fail flag 203 from the last cycle of the binary search calibration process was a pass or a fail. If the pass/fail flag 203 is at "1" (pass) indicating that the analog voltage 202 output by the DAC 235 during the last cycle was higher than the reference voltage 201, then the provisional DAC step (i.e., the DAC step identified by the binary search calibration process) will be the optimal DAC step and will be selected as the final DAC step for post-calibration operational use (see process 922). In this case, a final DAC code 214 corresponding to the provisional DAC step is forwarded to the DAC (at process step 990); the operation mode is initiated, during which, the output voltage adjustment circuitry 235 is deactivated in order to decrease the analog voltage 202 output from the DAC 230 by approximately (and ideally exactly) one half of a DAC step (e.g., by 2.5 mV) (see process step 992); and a final analog voltage and, particularly, a calibrated voltage (Vo) at the output node 205 is generated in response to the final DAC code 214 (at process 995). However, if the pass/fail flag 203 is at "0" (fail) indicating that the analog voltage 202 output by the DAC 235 during the last cycle was lower than the reference voltage 201, then the next higher DAC step above the DAC step identified by the binary search calibration process will be the optimal DAC step and selected as the final DAC step (see process process 921). In this case, the DAC step is incremented by 1 and a final DAC code 214 corresponding to this next higher DAC step is forwarded to the DAC (at process 990). Then, the operation mode is initiated, during the which, output voltage adjustment circuitry 235 is deactivated in order to decrease the analog voltage 202 output from the DAC 230 by approximately (and ideally exactly) one half of a DAC step (e.g., by 2.5 mV) (see process step 992); and a final analog voltage and, particularly, a calibrated voltage (Vo) at the output node 205 is generated in response to a final DAC code 214 (at process 995).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A calibration circuit comprising:
   a digital-to-analog converter (DAC) outputting an analog parameter and comprising output parameter adjustment circuitry;
   a comparator receiving a reference parameter and the analog parameter;
   a control circuit operably connected to the comparator and the DAC in a feedback loop; and
   DAC step select logic, wherein the calibration circuit is selectively operable in a calibration mode and an operation mode, wherein, during the calibration mode, the output parameter adjustment circuitry adjusts a magnitude of the analog parameter in a first direction by approximately a half DAC step and the control circuit uses the feedback loop to perform a calibration process in order to identify a provisional DAC step, and wherein, during the operation mode, the output parameter adjustment circuitry adjusts the magnitude of the analog parameter by approximately a half DAC step in a second direction opposite the first direction, the DAC step select logic selects one of the provisional DAC step and an adjacent DAC step as a final DAC step, the control circuit outputs a final DAC code corresponding to the final DAC step, and the DAC generates a calibrated parameter in response to the final DAC code.

2. The calibration circuit of claim 1,
   wherein the DAC comprises an N-bit DAC,
   wherein the calibration process is a binary search calibration process performed in N cycles to identify the provisional DAC step by an N-bit DAC code, and
   wherein each of the N cycles determines one bit in the N-bit DAC code from a first cycle that determines a most significant bit to an Nth cycle that determines a least significant bit.

3. The calibration circuit of claim 2, wherein the N-bit DAC is a 4-bit DAC such that the binary search calibration process is performed in 4 cycles.

4. The calibration circuit of claim 1, wherein, during the calibration mode, the control circuit determines whether the parameter being calibrated is with a calibration range of the calibration circuit.

5. The calibration circuit of claim 1,
   wherein the calibration process is a binary search calibration process, and
   wherein the DAC step select logic selects the provisional DAC step as the final DAC step when the provisional DAC step results in a pass flag from the comparator during a last cycle of the binary search calibration process and selects the adjacent DAC step when the provisional DAC step results in a fail flag from the comparator during the last cycle of the binary search calibration process.

6. The calibration circuit of claim 1, wherein the calibration process is a binary search calibration process enabled by a built-in self test engine.

7. The calibration circuit of claim 1, wherein the reference parameter comprises any of a voltage, a current, a temperature, a pressure, a frequency, and a timing signal.

8. A calibration circuit comprising:
   a digital-to-analog converter (DAC) outputting an analog voltage and comprising output voltage adjustment circuitry;
   a comparator receiving a reference voltage and the analog voltage;
   a control circuit operably connected to the comparator and the DAC in a feedback loop; and
   DAC step select logic,
   wherein the calibration circuit is selectively operable in a calibration mode and an operation mode,
   wherein, during the calibration mode, the output voltage adjustment circuitry increases a magnitude of the analog voltage by approximately a half DAC step and the control circuit uses the feedback loop to perform a binary search calibration process in order to identify a provisional DAC step, and wherein, during the operation mode, the output voltage adjustment circuitry decreases the magnitude of the analog voltage by approximately a half DAC step, the DAC step select logic selects one of the provisional DAC step and a next higher DAC step as a final DAC step, the control circuit outputs a final DAC code corresponding to the final DAC step, and the DAC generates a calibrated voltage in response to the final DAC code.

9. The calibration circuit of of claim 8, wherein the DAC comprises an N-bit DAC, wherein the binary search calibration process is performed in N cycles to identify the provisional DAC step by an N-bit DAC code, and wherein each of the N cycles determines one bit in the N-bit DAC code from a first cycle that determines a most significant bit to an Nth cycle that determines a least significant bit.

10. The calibration circuit of claim 9, wherein the N-bit DAC is a 4-bit DAC such that the binary search calibration process is performed in 4 cycles.

11. The calibration circuit of claim 8, wherein, during the calibration mode, the control circuit determines whether a voltage being calibrated is within a calibration range of the calibration circuit.

12. The calibration circuit of claim 8, wherein the DAC step select logic selects the provisional DAC step as the final DAC step when the provisional DAC step results in a pass flag from the comparator during a last cycle of the binary search calibration process and selects the next higher DAC step when the provisional DAC step results in a fail flag from the comparator during the last cycle of the binary search calibration process.

13. The calibration circuit of claim 8, wherein each DAC step is approximately 5 mV, wherein, during the calibration mode, the output voltage adjustment circuitry increases the magnitude of the analog voltage by approximately 2.5 mV, and wherein, during the operation mode, the output voltage adjustment circuitry decreases the magnitude of the analog voltage by approximately 2.5 mV.

14. The calibration circuit of claim 8, wherein the binary search calibration process is enabled by a built-in self-test engine.

15. A calibration method comprising:

operating a calibration circuit in a calibration mode, wherein the operating of the calibration circuit in the calibration mode comprises:

adjusting a magnitude of an analog parameter output by a digital-to-analog converter (DAC) by approximately a half DAC step in a first direction; and using a feedback loop between a control circuit and the DAC to perform a binary search calibration process in order to identify a provisional DAC step; and operating the calibration circuit in an operation mode, wherein the operating of the calibration circuit in the operation mode comprises:

adjusting the magnitude of the analog parameter output by the DAC by approximately a half DAC step in a second direction opposite the first direction;

selecting either the provisional DAC step or an adjacent DAC step as a final DAC step;

outputting a final DAC code corresponding to the final DAC step; and generating a calibrated parameter in response to the final DAC code.

16. The method of claim 15, wherein the DAC comprises an N-bit DAC, wherein the binary search calibration process is performed in N cycles to identify the provisional DAC step by an N-bit DAC code, and wherein each of the N cycles determines one bit in the N-bit DAC code from a first cycle that determines a most significant bit to an Nth cycle that determines a least significant bit.

17. The method of claim 16, wherein the N-bit DAC is a 4-bit DAC such that the binary search calibration process is performed in four cycles.

18. The method of claim 15, wherein operating in the calibration mode further comprises determining whether a parameter being calibrated is outside a calibration range of the calibration circuit.

19. The method of claim 15, wherein, during the calibration mode, the magnitude of the analog parameter is increased, wherein, during the operation mode, the magnitude of the analog parameter is decreased, and wherein the provisional DAC step is selected as the final DAC step when the provisional DAC step results in a pass flag from the comparator during a last cycle of the binary search calibration process and a next higher DAC step is selected as the final DAC step when the provisional DAC step results in a fail flag from the comparator during the last cycle of the binary search calibration process.

20. The method of claim 15, wherein the analog parameter comprises any of a voltage, a current, a temperature, a pressure, a frequency, and a timing signal.

* * * * *